US006635908B2

(12) United States Patent
Tanaka et al.

(10) Patent No.: US 6,635,908 B2
(45) Date of Patent: Oct. 21, 2003

(54) BURYING TYPE AVALANCHE PHOTODIODE AND FABRICATION METHOD THEREOF

(75) Inventors: Shigehisa Tanaka, Kunitachi (JP); Yasunobu Matsuoka, Hachioji (JP); Kazuhiro Ito, Hinode (JP); Tomohiro Ohno, Hachioji (JP); Sumiko Fujisaki, Hachioji (JP); Akira Taike, Kokubunji (JP); Tsukuru Ohtoshi, Hanno (JP); Shinji Tsuji, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 53 days.

(21) Appl. No.: 09/942,737

(22) Filed: Aug. 31, 2001

(65) Prior Publication Data

US 2002/0117697 A1 Aug. 29, 2002

(30) Foreign Application Priority Data

Feb. 26, 2001 (JP) ........................................ 2001-050054
Jun. 12, 2001 (JP) ........................................ 2001-176738

(51) Int. Cl.[7] ................ H01L 31/0328; H01L 31/0336; H01L 31/072; H01L 31/109
(52) U.S. Cl. ........................................ 257/186; 257/438
(58) Field of Search ................ 257/288, 438, 257/186, 458

(56) References Cited

U.S. PATENT DOCUMENTS 4,840,916 A * 6/1989 Yasuda et al. ................ 437/3
5,075,750 A * 12/1991 Kagawa ........................ 357/30
5,539,221 A * 7/1996 Tsuji et al. .................. 257/186
5,543,629 A * 8/1996 Nakamura et al. ............. 257/21
5,552,629 A * 9/1996 Watanabe .................... 257/438
5,654,578 A * 8/1997 Watanabe .................... 257/438
5,656,831 A * 8/1997 Kusakabe .................... 257/186
6,104,047 A * 8/2000 Watanabe .................... 257/186

FOREIGN PATENT DOCUMENTS

JP  6-232442  8/1994

* cited by examiner

Primary Examiner—Amir Zarabian
Assistant Examiner—Monica Lewis
(74) Attorney, Agent, or Firm—Antonelli, Terry, Stout & Kraus, LLP

(57) ABSTRACT

The object of disclosing the novel art consists in providing a highly reliable mesa-structured avalanche photo-diode using a novel structure capable of keeping the dark current low, and a fabrication method thereof. The avalanche photo-diode for achieving the object has an absorption layer for absorbing light to generate a carrier, a multiplication layer for multiplying the generated carrier, and a field control layer inserted between the absorption layer and the multiplication layer.

Moreover, a first mesa including at least part of the multiplication layer and part of the field control layer is formed over a substrate, a second mesa including another part of the field control layer and the absorption layer is formed over the first mesa, the area of the top surface of the first mesa is greater than that of the bottom surface of the second mesa, and a semiconductor layer is formed over the part of the first mesa top surface not covered by the second mesa and the side surface of the second mesa.

16 Claims, 15 Drawing Sheets

BURYING TYPE AVALANCHE PHOTODIODE AND FABRICATION METHOD THEREOF

BACKGROUND OF THE INVENTION

The present invention relates to an avalanche photo-diode and a fabrication method thereof. More particularly the invention pertains to a photo-detector using a semiconductor, and more particularly to a reliable avalanche photo-diode of a mesa structure having a low dark current.

An avalanche photo-diode for use in optical communication and the like is a semiconductor photo-detector whose photo-detecting sensitivity is enhanced by providing a layer for avalanche-multiplying a carrier generated by opto-electronic conversion in addition to an optical absorption region for carrying out opto-electronic conversion. Such an avalanche photo-diode indispensably requires a low dark current and high reliability.

Semiconductor photo-detectors, mostly formed of chemical compound semiconductors, can be broadly classified into planar structure and mesa structure photo-detectors. A mesa structure photo-diode is a diode having a structure in which a mesa is formed over a substrate and the mesa contains a pn junction. The mesa structure, though simple to fabricate, has disadvantages of low reliability and a high dark current. The reasons include the high electric field intensity of the pn junction emerging on a side surface of the mesa, a tendency for electric fields to concentrate on the periphery (edge) of the junction, and that for minute leak current paths to be readily formed by surface state and any surface defect formed on an exposed surface.

On the other hand, a planar structure photo-diode has a structure in which a pn junction region having a high electric field intensity is formed within a crystal, and the part exposed on the surface has a lower electric field intensity, resulting in higher reliability and a lower dark current. However, its fabrication process is complex, sometimes prohibitively difficult depending on the element structure, resulting in a disadvantage of poor practical usefulness.

As a method to alleviate the above-noted disadvantages of mesa-structured semiconductor photo-detectors, a structure to cover the side surface of the mesa with a burying-layer is disclosed in the Japanese Patent Laid-open (Kokai) No. Hei 6-232442. The technique disclosed therein will be described below with reference to FIG. 10. There is used a process in which, after mesas are formed on layers 82 through 88 crystal-grown over a substrate 81, a burying-layer 89 of a high-resistance semiconductor is grown over a side surface 90 and a periphery 91 of the mesa. A pn junction surface is formed between the layer 83 and the layer 84. In addition to them, electrodes 92 and 93 and an anti-reflection layer 94 are formed.

Since the mesa side surface 90 is covered by the burying-layer 89 in this structure, leak currents attributable to the surface state or any surface defect are less than they would be where the burying-layer 89 is absent.

SUMMARY OF THE INVENTION

However, as the electric field intensity around the pn junction emerging on the mesa side surface 90 remains strong in the above-described structure, it is difficult to achieve a low enough dark current or high enough reliability to make the photo-diode adequate for practical use. Especially in an element having a pn junction with a high electric field intensity, such as an avalanche photo-diode, a breakdown (edge breakdown) tends to occur around the junction, inevitably leading to a low rate of multiplication and poor uniformity.

An object of the present invention is to provide a highly reliable mesa-structured avalanche photo-diode using a novel structure capable of keeping the dark current low and a fabrication method therefor.

In order to achieve the above-stated object, an avalanche photo-diode according to the invention has an absorption layer for absorbing light to generate a carrier, a multiplication layer for multiplying the generated carrier, and a field control layer inserted between the absorption layer and the multiplication layer, wherein a first mesa including at least part of the multiplication layer and part of the field control layer is formed over a substrate, a second mesa including another part of the field control layer and the absorption layer is formed over the first mesa, and the area of the top of the first mesa is greater than that of the bottom of the second mesa. A semiconductor layer is formed over the part of the first mesa top surface not covered by the second mesa and the side surface of the second mesa. In the following description, the semiconductor layer will be referred to as the burying-layer.

Further in the avalanche photo-diode, the thickness of the part of the field control layer included in the first mesa is less than the thickness of the field control layer spanning between the first mesa and the second mesa as an additional characteristic.

In the avalanche photo-diode, a semiconductor layer is formed over the part of the first mesa top surface not covered by the second mesa and over the side surface of the second mesa as another additional characteristic. In the following description, if the thickness of the semiconductor layer is large enough to be approximately equal to the height of the second mesa, it will be referred to as a burying-layer, or if it is formed thin for the purpose of protecting the mesa surface, it will be referred to as a semiconductor protection film. It is preferable for this protection film to be a thin film, and to be an insulator or a semiconductor.

A possible structure of a structure avalanche photo-diode according to the invention having the above-stated characteristics will be shown in FIG. 1. While a more detailed description will be given afterwards, in FIG. 1, reference numeral 1 denotes an n-type InP substrate; 2, an n-type InAlAs buffer layer; 3, an n-type InAlAs/InGaAs multiplication layer; 4, a p-type InAlAs field control layer; 5, a p-type InGaAs absorption layer; 6, a p-type InAlAs cap layer; and 7, a p-type InGaAs contact layer.

A pn junction surface is formed on the boundary between the n-type multiplication layer 3 and the p-type field control layer 4. With the middle plane of the thickness of the field control layer 4 as the border, the layers below that plane constitute a first mesa 18 containing the pn junction while the layers above the constitute a second mesa 13.

The area of the top of the mesa 18 is greater than the area of the bottom of the mesa 13. Therefore, the top surface of the mesa 18 has a part not covered by the bottom of the mesa 13. In the following description, this part will be referred to as the peripheral surface of the second mesa (denoted by a reference numeral 15 in FIG. 1).

A burying-layer (regrown layer) 8 is formed over a side surface 14 and the peripheral surface 15 of the mesa 13. The burying-layer 8, whose carrier concentration is set substantially equal to or below that of the absorption layer 5, has a high resistance.

The above-described structure can serve to reduce the electric field intensity around the pn junction. The principle of this effect will be explained with reference to FIG. 2. Electric field designing is essential for an avalanche photodiode. The electric field intensity distribution in the multiplication layer 3, the field control layer 4, the absorption layer 5 in the mesa center represented by a broken line in FIG. 1 is as represented by a one-dot chain line in FIG. 2. Thus the electric field intensity is set higher in the multiplication layer 3 to induce avalanche multiplication and, conversely, that in the absorption layer 5 is set lower to avoid avalanche multiplication. Such a electric field intensity distribution can be formed by appropriately regulating the carrier concentration in the field control layer 4. Incidentally, as the carrier concentration in the cap layer 6 is set substantially higher than that in the absorption layer 5, no electric field is formed beyond the absorption layer 5.

Since the electric field intensity in the multiplication layer 3 is extremely high in this state, reliability will drop if it is exposed as it is on the element surface. According to the invention, with a view to securing sufficient reliability, note is taken of the possibility to reduce the electric field intensity of the multiplication layer 3 exposed on the surface.

The electric field intensity of the multiplication layer 3 can be varied by regulating either the concentration or the thickness of the field control layer 4. More specifically, if for example the concentration of the field control layer 4 is reduced to ½ or, without changing the concentration, its thickness is reduced to ½, the electric field intensity rise in the field control layer 4 will be reduced to ½ of the previous rise, and this eventually serves to reduce the electric field intensity in the multiplication layer 3.

Therefore, if the thickness of the field control layer 4 in the mesa periphery represented by a broken line in FIG. 1, i.e. the part to constitute the peripheral surface 15 of the mesa 13, is reduced and a burying-layer (regrown layer) 8 having a relatively low carrier concentration is formed over it, the electric field intensity distribution near the surface will be as represented by a solid line in FIG. 2, and this means the electric field intensity in the multiplication layer 3 can be reduced.

The proper thickness of the field control layer 4 in the part of the mesa peripheral surface 15 can be determined according to the electric field design of the element, and obviously it is not limited to the ½ reduction mentioned above. It is also to be noted that the thickness of the field control layer 4 in the part of the mesa peripheral surface 15 may increase toward the substrate 1. In such a case, too, a similar effect can be achieved by setting that thickness smaller than that of the field control layer 4 spanning between the mesa 13 and the mesa 18, i.e. that of the field control layer 4 at the mesa center.

Further, if the thickness of the field control layer at the mesa center is set greater, the above-noted effect can still be achieved even in the absence of the burying-layer 8.

FIG. 3 shows the result of computation of the electric field distribution in an element according to the present invention. In this case, the thickness of a field control layer 204 (p-type, $7 \times 10^{17}$ cm$^{-3}$ in impurity concentration) is 0.05 µm in the mesa part and 0.03 µm on the mesa periphery. The electric field distribution in a multiplication layer 203, the field control layer 204 and an absorption layer 205 in the mesa part, which constitutes the central part of the element shown in the upper half of FIG. 3, is as represented by a solid line in the lower half. Thus, it is necessary to set the electric field higher in the multiplication layer to induce avalanche multiplication and, conversely, lower in the absorption layer to avoid avalanche multiplication and the occurrence of a tunneling current. This optimization of electric field distribution can be achieved by appropriately designing the carrier concentration in the field control layer. The electric field distribution in the mesa periphery in FIG. 3 is as represented by a broken line in the lower half of FIG. 3. Since the electric field here is lower than in the electric field distribution in the mesa part (solid line), the edge breakdown can be restrained and the dark current reduced. This is due to the absence of the absorption layer in the mesa periphery and to the effect of the 2-dimensional structure that the overall film thickness of the semiconductor on the mesa periphery is less than that of the semiconductor in the mesa part. Therefore, the voltage applied to the multiplication layer in the mesa periphery is reduced, and the electric field is lowered as a result.

By lowering the electric field intensity near the surface, it is made possible to reduce leak currents attributable to the surface state or any surface defect and accordingly the dark current while enhancing reliability at the same time.

BRIEF DESCRIPTION OF THE DRAWINGS

FIG. 19b is a sectional view for describing the avalanche photo-diode shown in FIG. 19a.

DESCRIPTION OF THE PREFERRED EMBODIMENTS

Avalanche photo-diodes and fabrication methods thereof according to the present invention will be described in further detail below with reference to illustrated preferred embodiments thereof.

Embodiment 1

Figure 1:
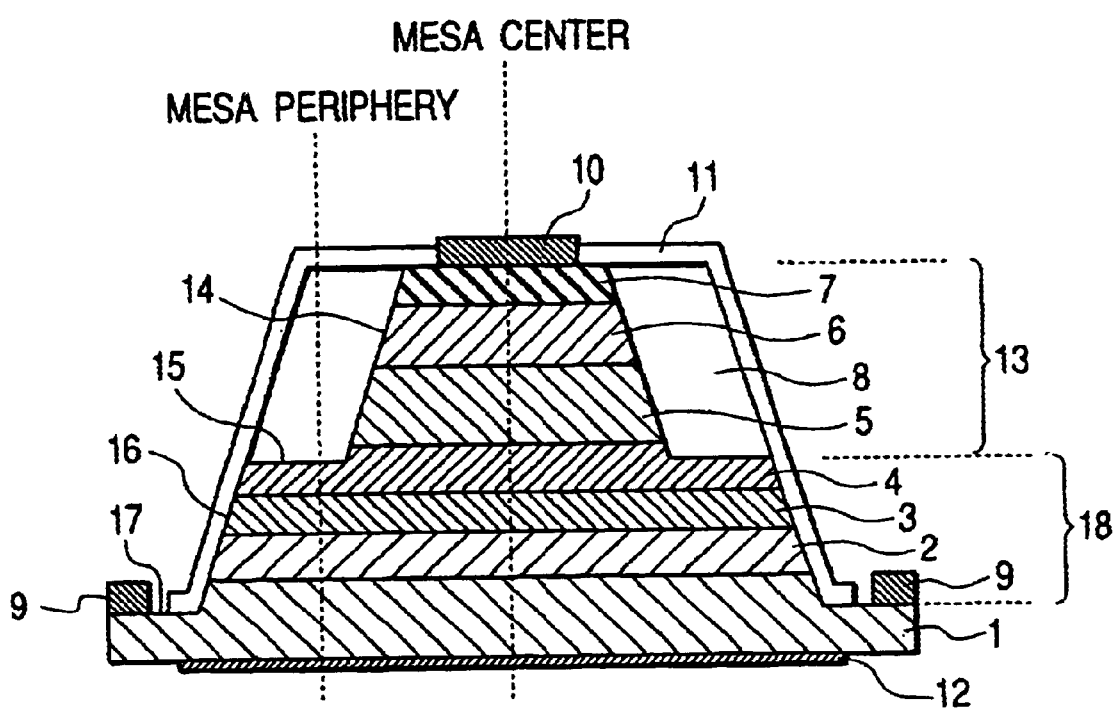
FIG. 1 is a sectional view for describing an avalanche photo-diode, which is a first preferred embodiment of the present invention.
Figure 2:
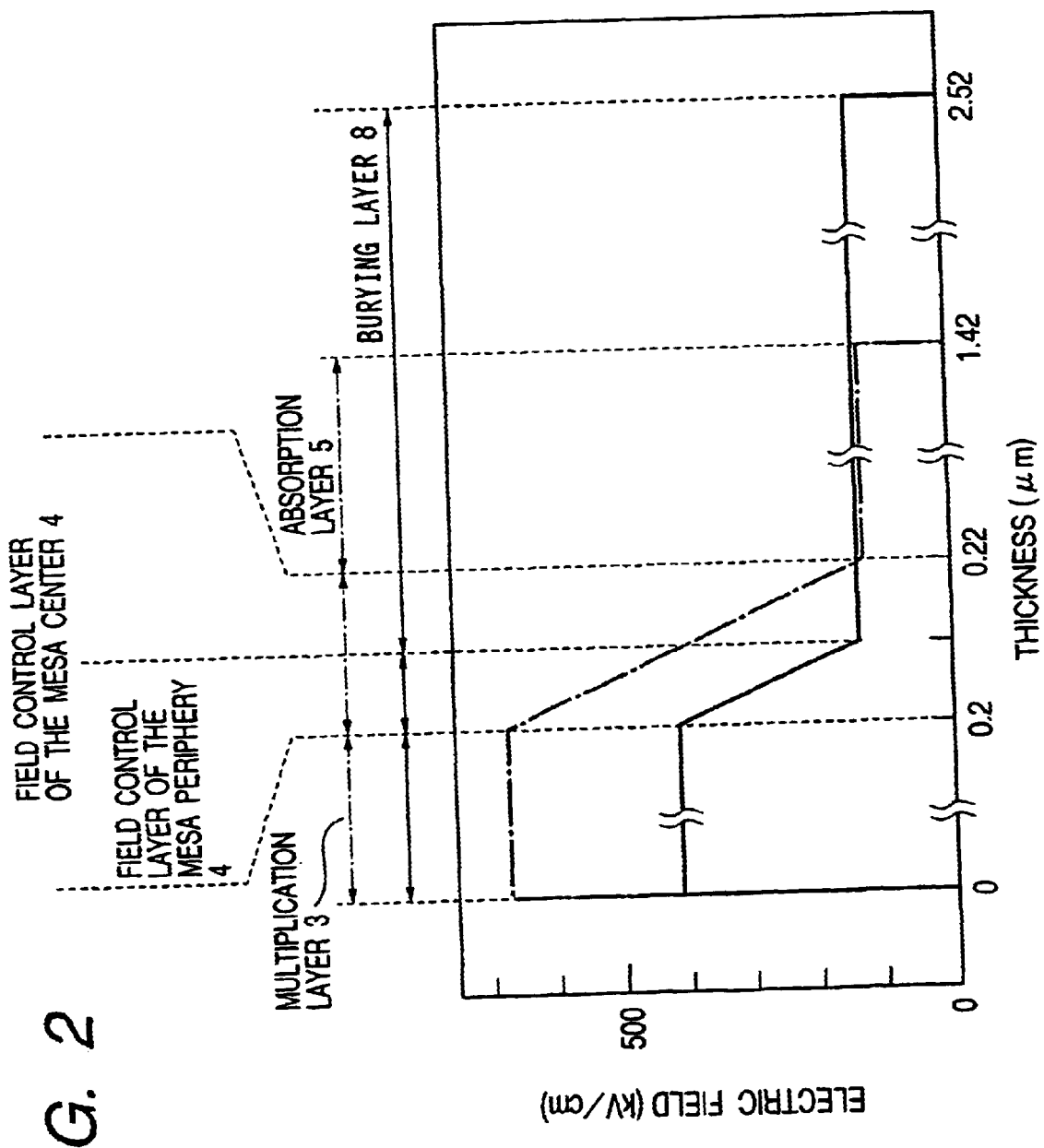
FIG. 2 is a diagram for describing the electric field intensity distribution in the first embodiment of the invention.
Figure 3:
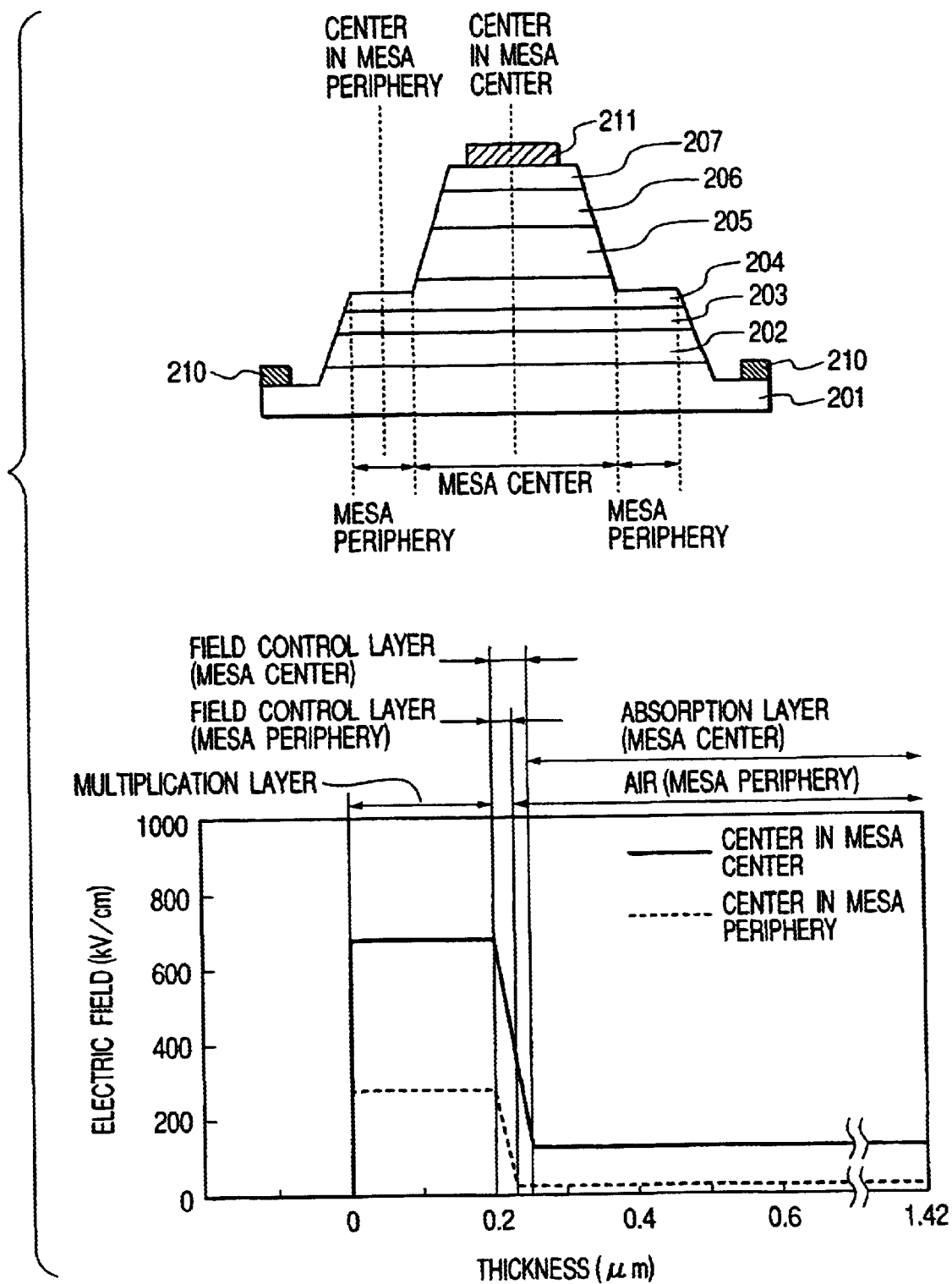
FIG. 3 is a diagram for describing the electric field intensity distribution in a fourth embodiment of the invention.

FIG. 1 illustrates a section of the structure of the avalanche photo-diode, which is Embodiment 1 of the invention. In FIG. 1, with the conductivity type, carrier concentration and thickness of each layer being indicated between parentheses, reference numeral 1 denotes an InP substrate (n-type, $1\times10^{19}$ cm$^{-3}$); 2, an InAlAs buffer layer (n-type, $2\times10^{18}$ cm$^{-3}$, 0.7 $\mu$m); 3, an InAlAs/InGaAs multiplication layer (n-type, $5\times10^{14}$ cm$^{-3}$, 0.2 $\mu$m); 4, an InAlAs field control layer (p-type, $7\times10^{17}$ cm$^{-3}$, 0.02 $\mu$m); 5, an InGaAs absorption layer (p-type, $2\times10^{15}$ cm$^{-3}$, 1.2 $\mu$m); 6, an InAlAs cap layer (p-type, $2\times10^{18}$ cm$^{-3}$, 1 $\mu$m); and 7, an InGaAs contact layer (p-type, $5\times10^{19}$ cm$^{-3}$, 0.1 $\mu$m).

As will be described in further detail below, the second mesa 13 is formed by etching, after forming these crystal layers over the substrate 1, from the crystal surface to midway of the field control layer 4. Whereas the shape of the mesa 13 can be chosen as preferable out of a circle, oval, rectangle, stripe or branch type, it is a circle in this embodiment. In FIG. 1, reference numerals 14 and 15 respectively denote a side surface and a peripheral surface of the mesa 13, the peripheral surface 15 being formed on the field control layer 4.

Reference numeral 8 denotes a burying-layer, which is formed on the side surface 14 and the peripheral surface 15 of the mesa 13. The carrier concentration of the burying-layer 8, which should preferably be not higher than that of the absorption layer 5, is $1\times10^{14}$ m$^{-3}$ of the p-type in this embodiment. The burying-layer 8, which should preferably have a sufficient thickness for the layer to reach a higher position than the absorption layer 5 on the peripheral surface 15 of the mesa 13, is 2.31 $\mu$m thick in this embodiment, a sufficient thickness to let the burying-layer 8 reach the cap layer 7.

The first mesa 18 is formed by etching to a depth crossing the pn junction surface (the boundary between the multiplication layer 3 and the field control layer 4), leaving the burying-layer 8 of an appropriate width outside the mesa 13. In FIG. 1, reference numerals 16 and 17 respectively denote a side surface and a peripheral surface of the mesa 18. Whereas the shape of the mesa 18 can be chosen as preferable out of a circle, oval, rectangle, stripe or branch type, it has to be large enough to contain the mesa 13 within. In the embodiment illustrated in FIG. 1, the mesa 18 has a circular shape, concentric with the mesa 13.

The pn junction surface emerges on the side surface 16 of the mesa 18. The peripheral surface 17 of the mesa 18 may only be in a position deeper than the pn junction surface, and in this particular embodiment reaches the substrate 1. The side surface 16 of the mesa 18 and the surface of the burying-layer 8 are coated with a protection film 11. Further, an electrode 10 is provided over the surface of the contact layer 7, another electrode 9 on the bottom surface 17 (the peripheral surface 17) of the mesa 18, and an anti-reflection film 12 on the back side of the substrate 1. Whether to provide a protection film and an anti-reflection film and their types, if they are to be provided, and the types and positions of the electrodes can be freely selected according to the pertinent requirements.

Figure 4A:
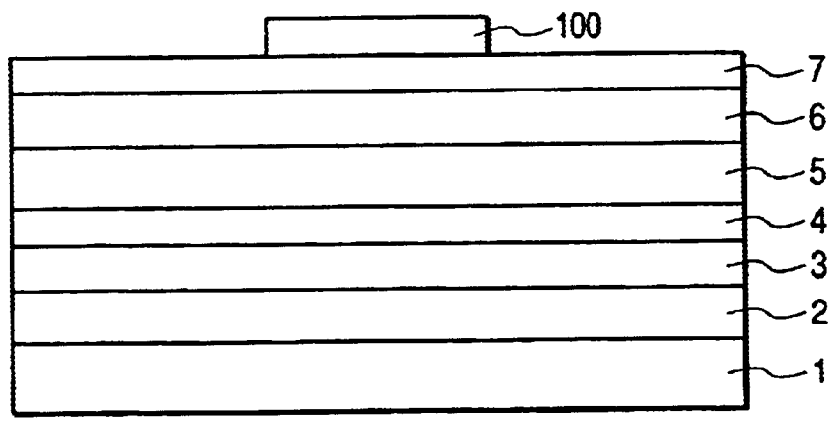
FIGS. 4a, 4b and 4c are a process flow diagram for describing a fabrication method for the first embodiment.

A fabrication method for the avalanche photo-diode having the above-described mesa structure will now be described with reference to FIGS. 4a, 4b, 4c, 5a and 5b. First, as shown in FIG. 4a, crystal layers 2 through 7 (the same reference numerals as for the layers 2 through 7 are respectively assigned) to become the layers 2 through 7 were grown over the InP substrate 1 by molecular beam epitaxy (MBE) to form a multi-layer crystal, followed by the formation of an SiO$_2$ mask 100 of 35 $\mu$m in diameter over the surface of the crystal layer 7. The composition, conductivity type, carrier concentration and thickness of each crystal layer were as stated above.

Figure 4B:
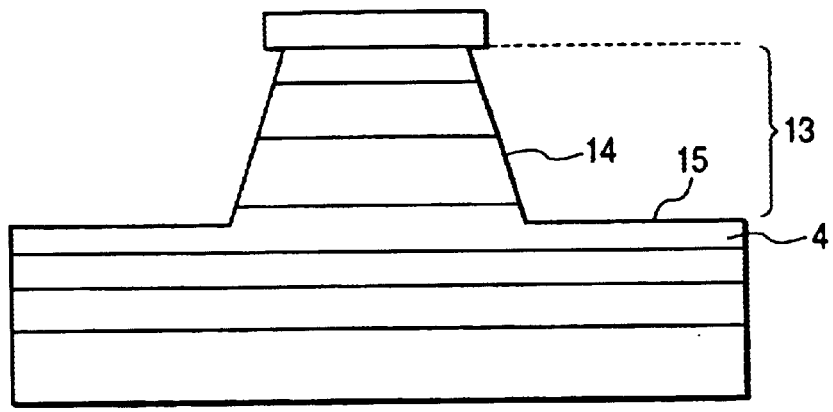

Then, wet etching was carried out for removal to midway of the crystal layer 4 to achieve the state of FIG. 4b. By now, the side surface 14 and the peripheral surface 15 of the mesa 13 were formed. The crystal layer 4 had emerged on the peripheral surface 15.

The process so far described reduced the thickness of the field control layer 4 on the mesa periphery to less than that of the field control layer 4 of the mesa center.

Figure 4C:
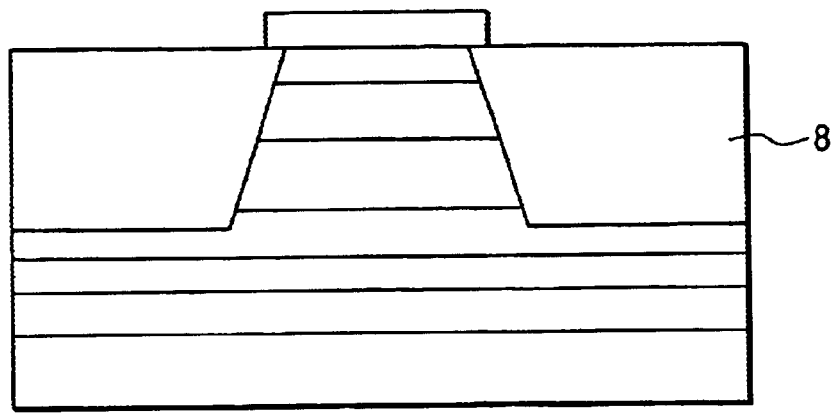

Next, an InAlAs (p-type, $1\times10^{14}$ cm$^{-3}$) crystal layer 8 to serve as the burying-layer 8 was grown by MBE into the state shown in FIG. 4c. Here, the crystal layer 8 covered the peripheral surface 15 and the side surface 14 of the mesa 13, and was grown to a thickness of 2.31 $\mu$m on the peripheral surface 15 of the mesa 13.

Figure 5A:
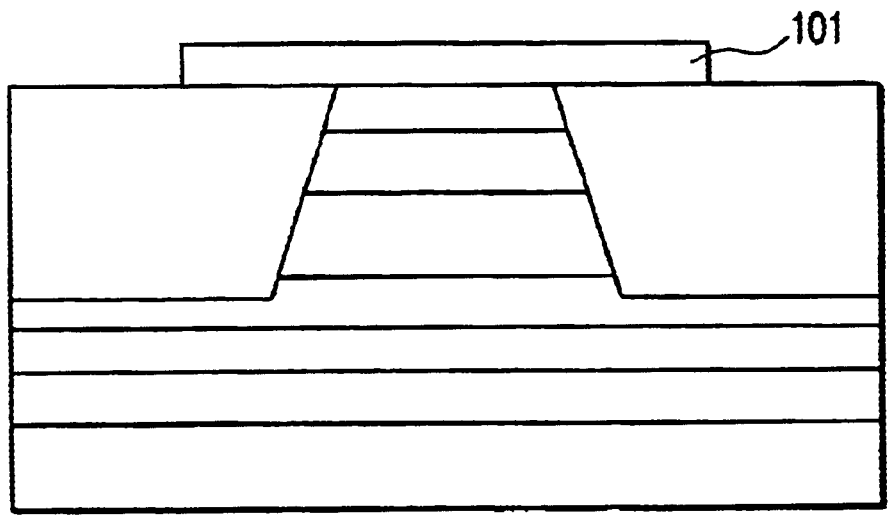
FIGS. 5a and 5b are a process flow diagram for describing the fabrication method for the first embodiment following up FIG. 4c.

The SiO$_2$ mask 100 was removed, and a photo-resist mask 101 having a larger diameter than the mask 100 was newly formed into the state shown in FIG. 5a. The photo-resist mask 101 measures 45 $\mu$m in diameter, and is positioned concentrically with the mask 100 of FIG. 4a.

Figure 5B:
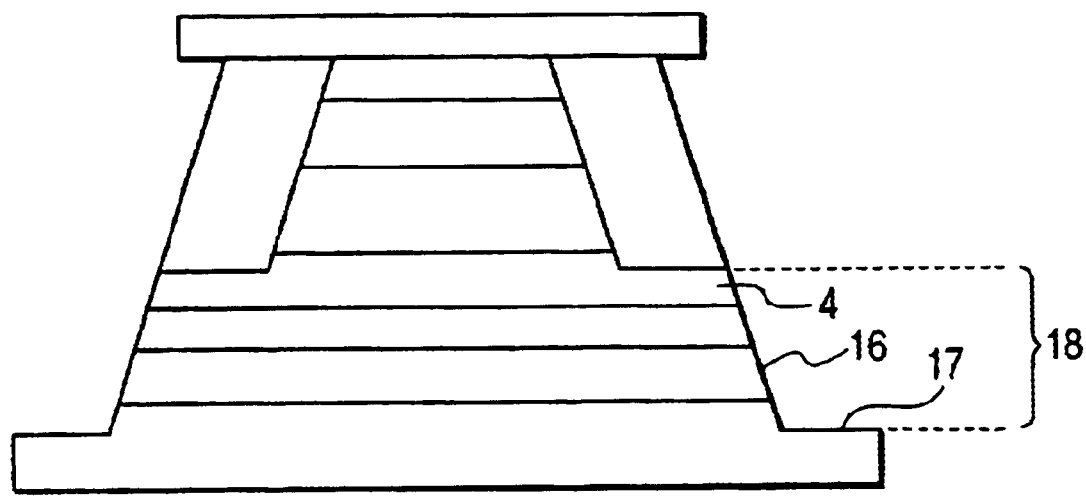

Wet etching was carried out down to the substrate 1 into the state shown in FIG. 5b. The mesa 18 having the side surface 16 and the peripheral surface 17 was thereby formed.

Finally, as shown in FIG. 1, from the contact layer 7 to the peripheral surface 17 of the mesa 18, coating with the protection film (SiN/SiO$_2$, 0.1 $\mu$m/0.3 $\mu$m in thickness) 11 was applied. Also, the protection film 11 coating the contact layer 7 and the peripheral surface (the exposed surface of the substrate) 17 of the mesa 18 was partially removed to form the electrodes (TiPtAu, 1.5 $\mu$m in thickness) 9 and 10, and the back surface of the substrate 1 (the side reverse to where the mesas 13 and 18 were formed) was coated with the anti-reflection film (SiN, 0.12 $\mu$m in thickness) 12 to form a chip.

When a reverse bias was applied to the fabricated chip, the breakdown voltage (Vb) was 24 V and the dark current at 0.9 Vb was 50 nA, both sufficiently low. In a high temperature reverse-biased load test (constant at 200° C., 100 $\mu$A), the voltage variation 1000 hours later was no more than 1 V, and neither the breakdown voltage nor the dark current at room temperature manifested any change from their respective pre-test levels, revealing high reliability and generally satisfactory performance. The multiplication rate of optical signals was 50 at the maximum, proving uniform at the mesa center.

Figure 6:
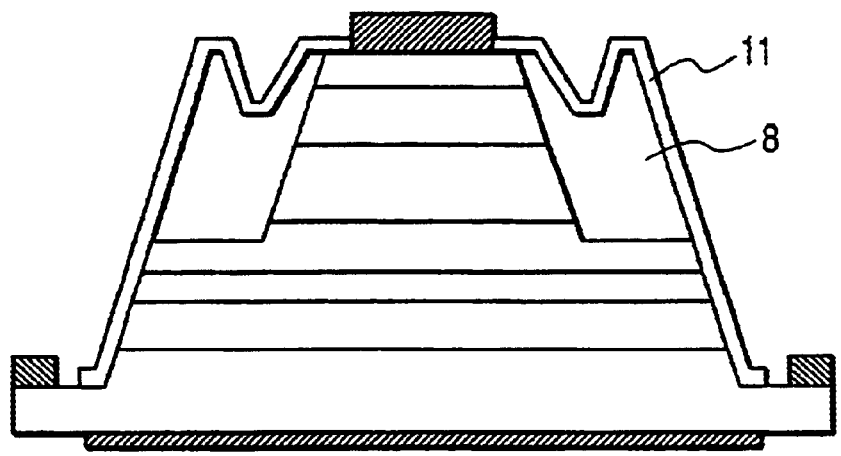
FIG. 6 is a sectional view for supplementary description of the first embodiment of the invention.

Further, as shown in FIG. 6, similar element performance was observed of a chip of which the top surface of the burying-layer 8 was not flat, demonstrating that the characteristics of this element were not dependent on the shape of the burying-layer.

Embodiment 2

Since the field control layer of an avalanche photo-diode is as thin as about 0.05 μm, it is sometimes difficult to stop etching midway of the field control layer. A sectional structure of an avalanche photo-diode used in such a case is illustrated in FIG. 7.

Figure 7:
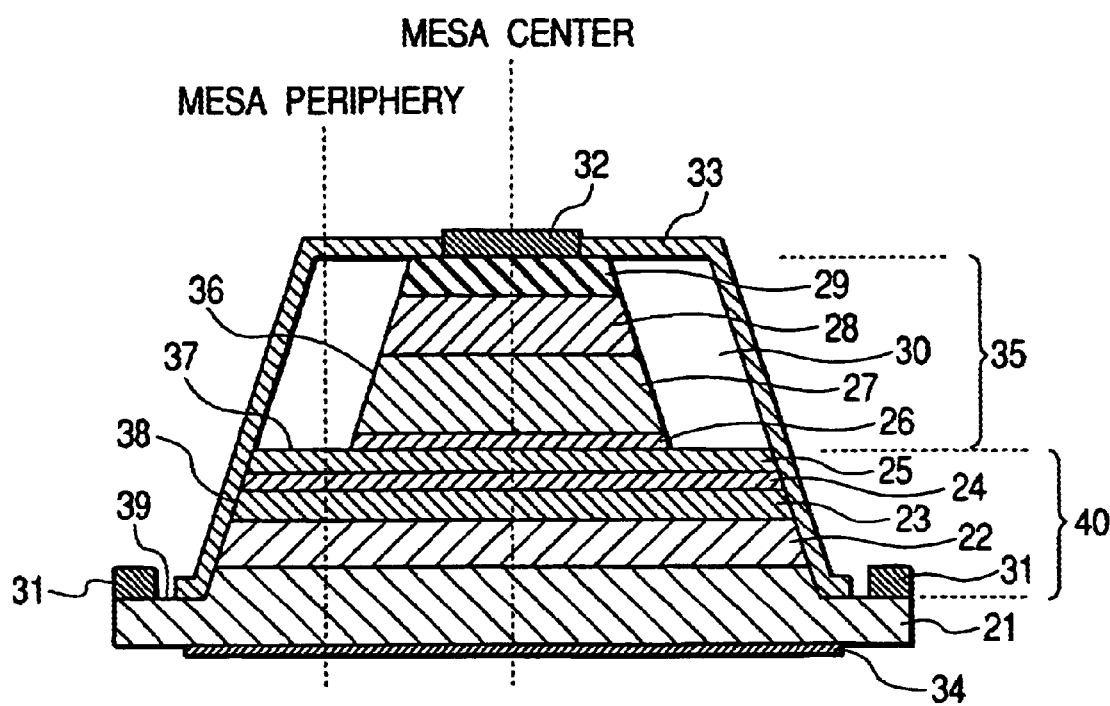
FIG. 7 is a sectional view for describing another avalanche photo-diode, which is a second preferred embodiment of the invention.

In FIG. 7, reference numeral 21 denotes an InP substrate (n-type, $1\times10^{19}$ cm$^{-3}$); 22, an InAlAs buffer layer (n-type, $2\times10^{18}$ cc$^{-3}$, 0.7 μm); 23, an InAlAs/InGaAs multiplication layer (n-type, $5\times10^{14}$ cm$^{-3}$, 0.2 μm); 24, an InAlAs field control layer (p-type, $7\times10^{17}$ cm$^{-3}$, 0.02 μm); 25, an InGaAs field control layer (p-type, $7\times10^{17}$ cm$^{-3}$, 0.01 μm); 26, an InAlAs field control layer (p-type, $7\times10^{17}$ cm$^{-3}$, 0.02 μm); 27, an InGaAs absorption layer (p-type, $2\times10^{15}$ cm$^{-3}$, 1.2 μm); 28, an InGaAlAs cap layer (p-type, $2\times10^{18}$ cm$^{-3}$, 1 μm); and 29, an InGaAs contact layer (p-type, $5\times10^{19}$ cm$^{-3}$, 0.1 μm).

As will be described in further detail below, a circular second mesa 35 is formed by etching, after forming these crystal layers over the substrate 21, from the crystal surface to the field control layer 26. In FIG. 7, reference numerals 36 and 37 respectively denote a side surface and a peripheral surface of the mesa 35, the peripheral surface 37 being formed on the field control layer 25.

Reference numeral 30 denotes a burying-layer, which is formed on the side surface 36 and the peripheral surface 37 of the mesa 35.

A first mesa 40 is formed by etching to a depth crossing the pn junction surface (the boundary between the multiplication layer 23 and the field control layer 24) leaving the burying-layer 30 of an appropriate width outside the mesa 35. In FIG. 7, reference numerals 38 and 39 respectively denote a side surface and a peripheral surface of the mesa 40. The mesa 40 has a large enough size to contain the mesa 35 within. In the embodiment illustrated in FIG. 7, the mesa 40 has a circular shape, concentric with the mesa 35.

The pn junction surface emerges on the side surface 38 of the mesa 40. The peripheral surface 39 of the mesa 40 may only be in a position deeper than the pn junction surface, and in this particular embodiment reaches the substrate 21. The side surface 38 of the mesa 40 and the surface of the burying-layer 30 are coated with a protection film 33. Further, an electrode 32 is provided over the surface of the contact layer 29, another electrode 31 on the bottom surface 39 of the mesa 40, and an anti-reflection film 34 on the back side of the substrate 21.

Figure 8A:
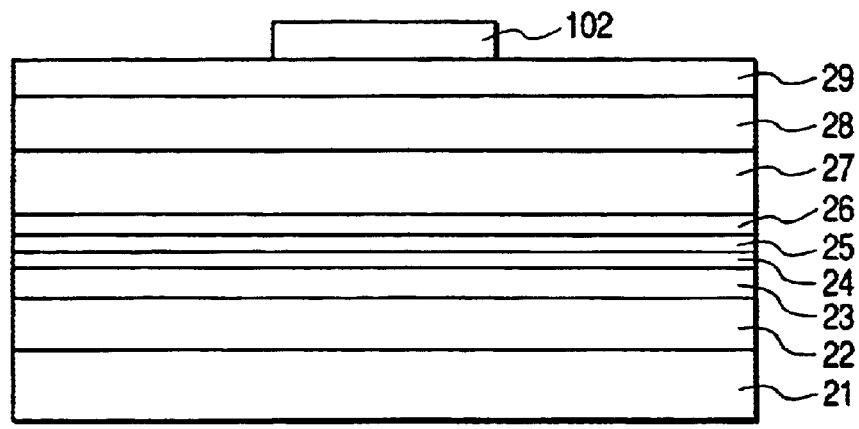
FIGS. 8a, 8b and 8c are a process flow diagram for describing a fabrication method for the second embodiment.

A fabrication method for the avalanche photo-diode having the above-described mesa structure will now be described with reference to FIGS. 8a, 8b, 8c, 9a and 9b. First, as shown in FIG. 8a, crystal layers 22 through 29 (the same reference numerals as for the layers 22 through 29 are respectively assigned) to become the layers 22 through 29 were grown over the InP substrate 21 by MBE to form a multi-layer crystal, followed by the formation of an SiO$_2$ mask 102 of 35 μm in diameter over the surface of the crystal layer 29. The composition, conductivity type, carrier concentration and thickness of each crystal layer were as stated above between parentheses.

Figure 8B:
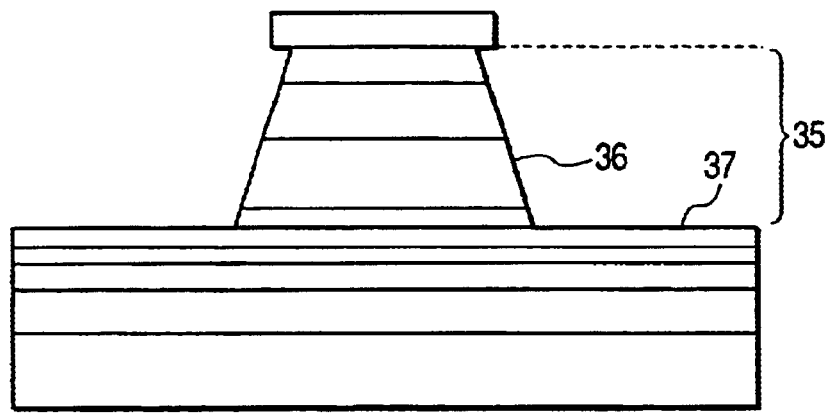

Removal by etching was carried out to the InAlAs crystal layer 26 by alternately applying etching solutions selectively working on InAlAs and InGaAs to the above-described composition to achieve the state shown in FIG. 8b. By now, the mesa 35 having the side surface 36 and the peripheral surface 37 were formed. The crystal layer 25 had emerged on the peripheral surface 37.

The process so far described reduced the thickness of the field control layer on the mesa periphery to less than that of the field control layer of the mesa center.

Figure 8C:
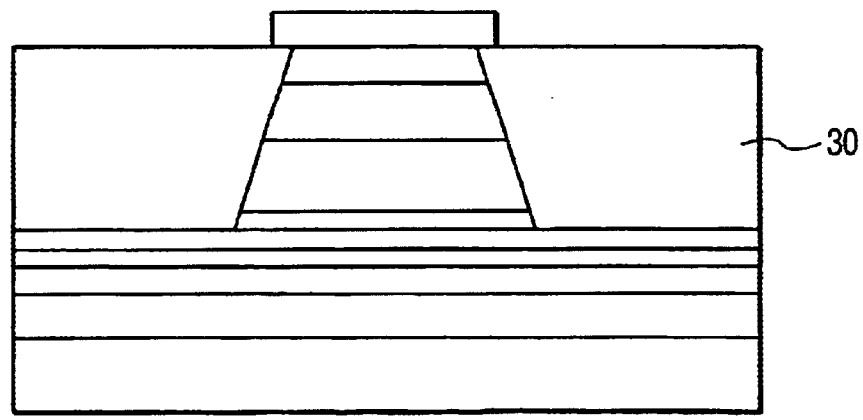

Next, an InAlAs (p-type, $1\times10^{14}$ cm$^{-3}$) crystal layer 30 to serve as the burying-layer 30 was grown by MBE into the state shown in FIG. 8c. Here, the crystal layer 30 covered the peripheral surface 37 and the side surface 36 of the mesa 35, and was grown to a thickness of 2.32 μm on the peripheral surface 37 of the mesa 35.

Figure 9A:
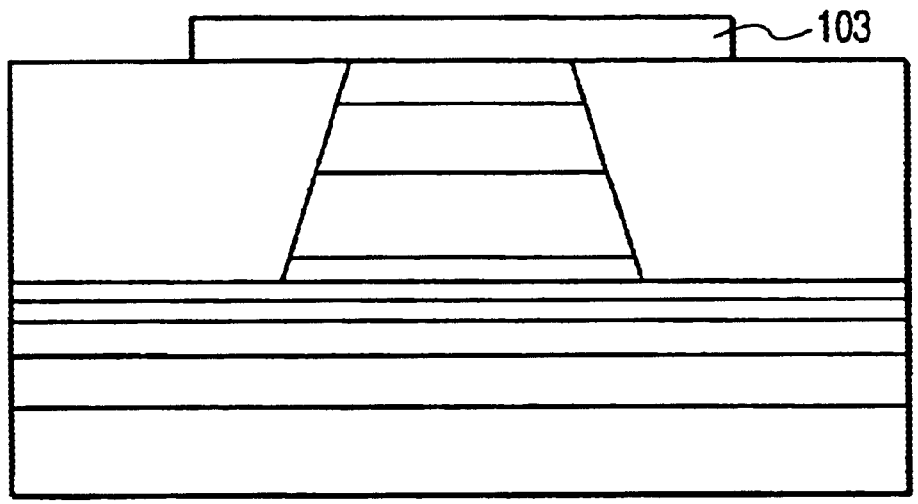
FIGS. 9a and 9b are a process flow diagram for describing the fabrication method for the second embodiment following up FIG. 8c.

The SiO$_2$ mask 102 was removed, and a photo-resist mask 103 having a larger diameter than the mask 102 was newly formed into the state shown in FIG. 9a. The photo-resist mask 103 measures 45 μm in diameter, and is positioned concentrically with the mask 102 of FIG. 8a.

Figure 9B:
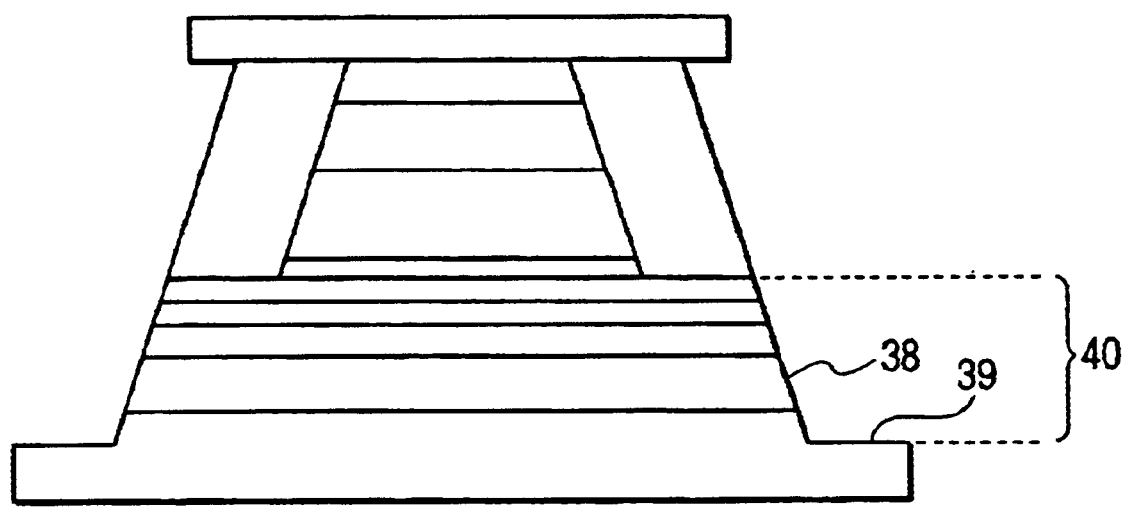
Figure 10:
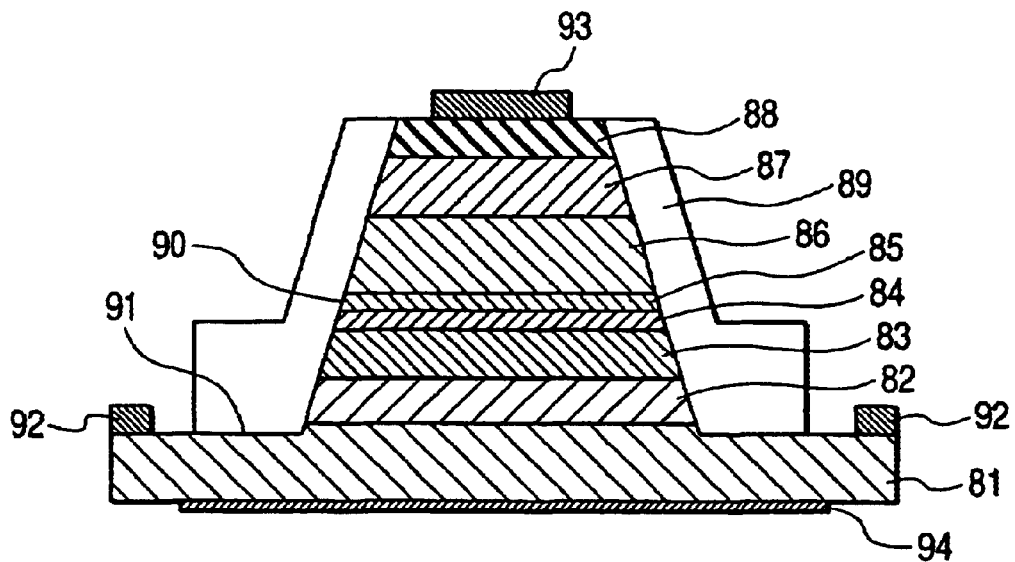
FIG. 10 is a sectional view for describing another avalanche photo-diode, which is an embodiment of the prior art.

Wet etching was carried out down to the substrate 21 into the state shown in FIG. 9b. The mesa 40 having the side surface 38 and the peripheral surface 39 was thereby formed.

Finally, as shown in FIG. 7, from the contact layer 29 to the peripheral surface 39 of the mesa 40, coating with the protection film (SiN/SiO$_2$, 0.1 μm/0.3 μm in thickness) 33 was applied. Also, the protection film 33 coating the contact layer 29 and the peripheral surface (the exposed surface of the substrate) 39 of the mesa 40 was partially removed to form the electrodes (TiPtAu, 1.5 μm in thickness) 31 and 32, and the back surface of the substrate 21 (the side reverse to where the mesas 35 and 40 were formed) was coated with the anti-reflection film (SiN, 0.12 μm in thickness) 34 to form a chip.

When a reverse bias was applied to the fabricated chip, the breakdown voltage (Vb) was 24 V and the dark current at 0.9 Vb was 50 nA, both sufficiently low. In a high temperature reverse-biased load test (constant at 200° C., 100 μA), the voltage variation 1000 hours later was no more than 1 V, and neither the breakdown voltage nor the dark current at room temperature manifested any change from their respective pre-test levels, revealing high reliability and generally satisfactory performance. The multiplication rate of optical signals was 50 at the maximum, proving uniform at the mesa center.

When the PIN-type photo-diode of a conventional 10-gigabit optical receiver was replaced with this avalanche photo-diode, the minimum reception sensitivity was substantially enhanced from −19 dBm to −28 dBm. An optical module is configured by mounting this optical receiver and other necessary components.

Embodiment 3

Figure 11:
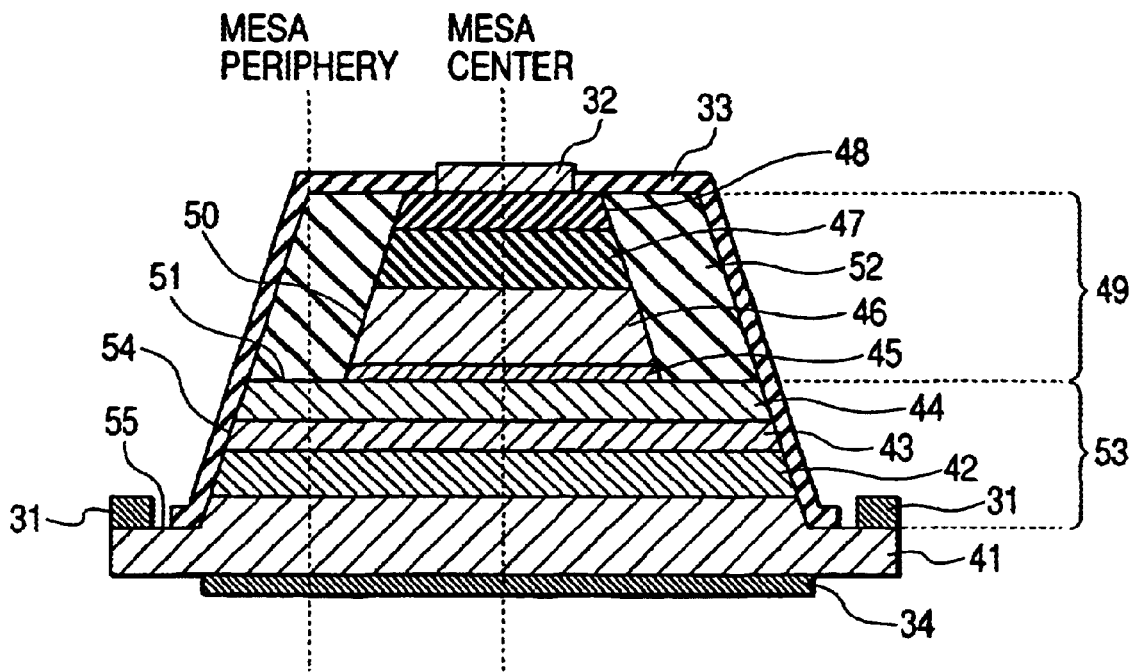
FIG. 11 is a sectional view for describing another avalanche photo-diode, which is a third preferred embodiment of the invention.

A sectional structure of an avalanche photo-diode fabricated by using vapor phase epitaxy (VPE) for crystal growth is shown in FIG. 11.

In FIG. 11, reference numeral 41 denotes an InP substrate (n-type, $5\times10^{18}$ cm$^{-3}$); 42, an InAlAs buffer layer (n-type, $2\times10^{18}$ cm$^{-3}$, 0.7 μm); 43, an InAlAs/InGaAs multiplication layer (n-type, $5\times10^{14}$ cm$^{-3}$, 0.2 μm); 44, an InAlAs field control layer (p-type, $7\times10^{17}$ cm$^{-3}$, 0.04 μm); 45, an InGaAs field control layer (p-type, $7\times10^{17}$ cm$^{-3}$, 0.02 μm); 46, an InAlAs absorption layer (p-type, $1\times10^{15}$ cm$^{-3}$, 1.2 μm); 47, an InGaAlAs cap layer (p-type, $5\times10^{17}$ cm$^{-3}$, 1 μm); and 48, an InGaAs contact layer (p-type, $5\times10^{18}$ cm$^{-3}$, 0.1 μm).

As will be described in further detail below, a circular second mesa 49 is formed by etching, after forming these crystal layers over the substrate 41, from the crystal surface to the field control layer 45. In FIG. 11, reference numerals 50 and 51 respectively denote a side surface and a peripheral surface of the mesa 49, the peripheral surface 51 being formed on the field control layer 44.

Reference numeral 52 denotes a burying-layer, which is formed on the side surface 50 and the peripheral surface 51 of the mesa 49.

A first mesa 53 is formed by etching to a depth surpassing the pn junction surface, leaving the burying-layer 52 of an appropriate width outside the mesa 49. In FIG. 11, reference numerals 54 and 55 respectively denote a side surface and a peripheral surface of the mesa 53. The mesa 53 has a large enough size to contain the mesa 49 within. In this embodiment, the mesa 53 has a circular shape, concentric with the mesa 49.

Figure 12A:
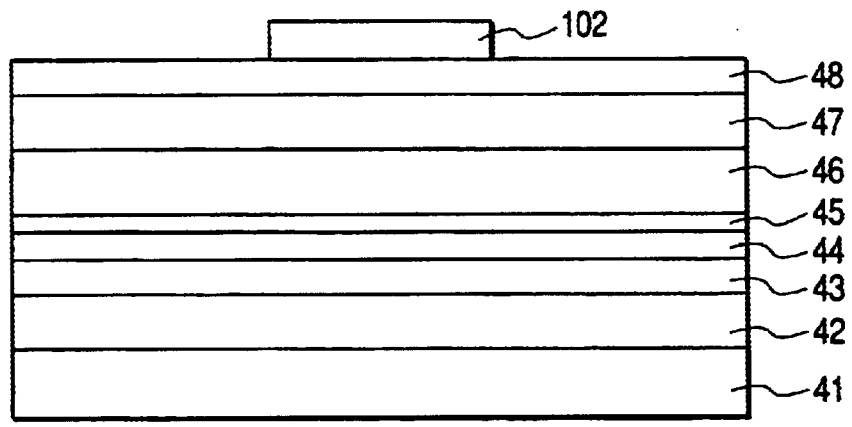
FIGS. 12a, 12b and 12c are a process flow diagram for describing a fabrication method for the third embodiment.

A fabrication method for the avalanche photo-diode having the above-described mesa structure will now be described with reference to FIGS. 12a, 12b, 12c, 13a and 13b. First, as shown in FIG. 12a, crystal layers (the same reference numerals as for the layers 42 through 48 are respectively assigned) to become the layers 42 through 48 were grown over the InP substrate 41 by organometallic vapor phase epitaxy (MOVPE) to form a multi-layer crystal, followed by the formation of an SiO$_2$ mask 102 of 35 μm in diameter over the surface of the crystal layer 48. The composition of each crystal layer is as stated above for the corresponding one of the layers 42 through 48, and the conductivity type, carrier concentration and thickness of each crystal layer are as stated above between parentheses.

Figure 12B:
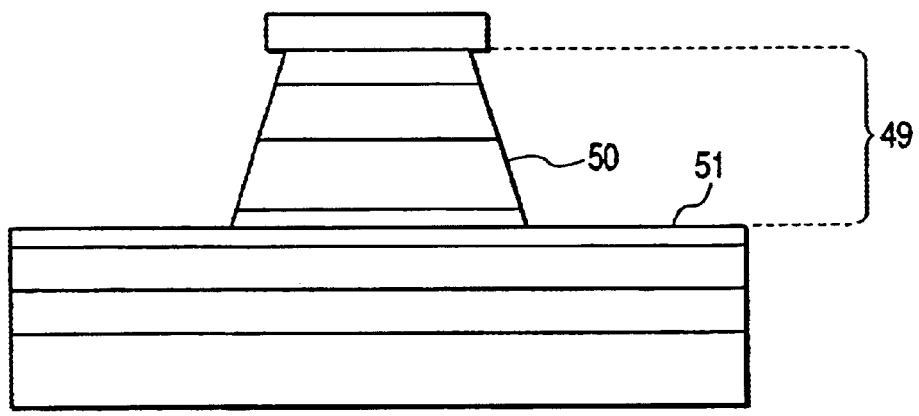

Removal by etching was carried out to the InGaAs crystal layer 45 by alternately applying etching solutions selectively working on the P type and the As type to the above-described composition to achieve the state shown in FIG. 12b. By now, the mesa 49 having the side surface 50 and the peripheral surface 51 was formed. The crystal layer 44 had emerged on the peripheral surface 51.

The process so far described reduced the thickness of the field control layer on the mesa periphery to less than that of the field control layer of the mesa center.

Figure 12C:
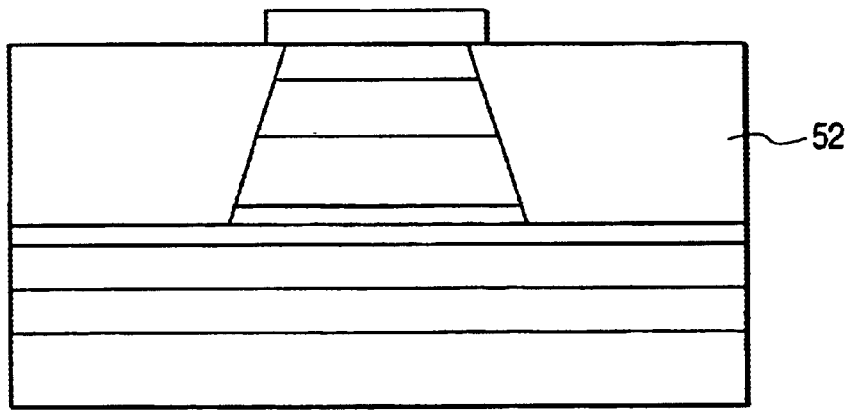

Next, an InP (p-type, 1×10$^{15}$ cm$^{-3}$) crystal layer 52 to serve as the burying-layer 52 was grown by chloride-based VPE as shown in FIG. 12c. Here, the crystal layer 52 covered the peripheral surface 50 and the side surface 51 of the mesa 49, and was grown to a thickness of 2.32 μm on the peripheral surface of the mesa 49. The crystal layer 52 may as well be grown by MOVPE from semi-insulating InP doped with Fe.

Figure 13A:
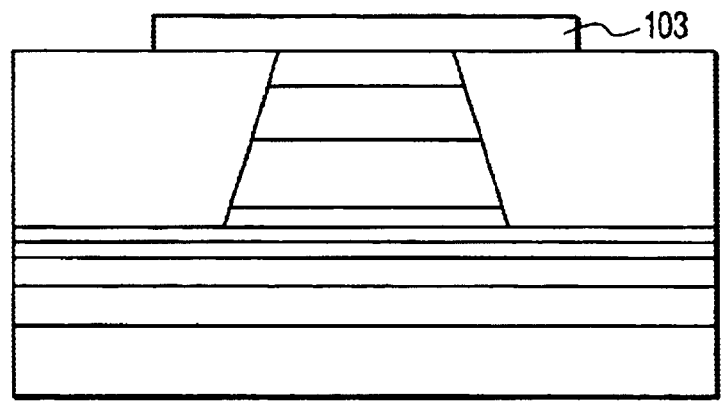
FIGS. 13a and 13b are a process flow diagram for describing the fabrication method for the third embodiment following up FIG. 12c.

The SiO$_2$ mask 102 was removed, and a photo-resist mask 103 having a larger diameter than the mask 102 was newly formed into the state shown in FIG. 13a. The photo-resist mask 103 measures 45 μm in diameter, and is positioned concentrically with the mask 102 of FIG. 12a.

Figure 13B:
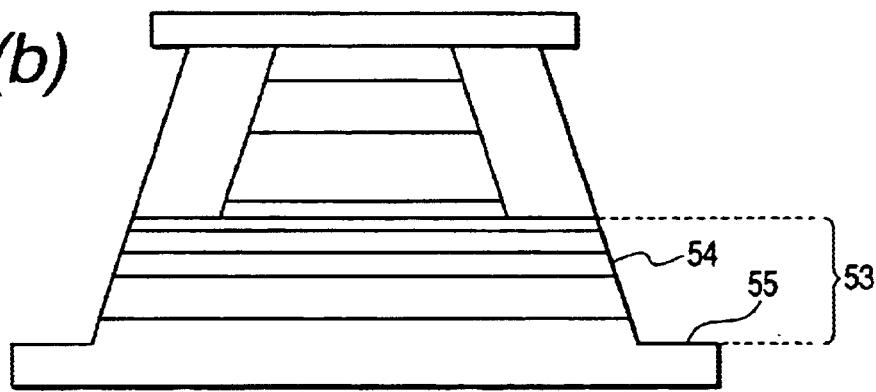

Wet etching was carried out down to the substrate 41 into the state shown in FIG. 13b. The mesa 53 having the side surface 54 and the peripheral surface 55 was thereby formed.

Finally, as shown in FIG. 11, from the contact layer 48 to the peripheral surface 55 of the mesa 53, coating with the protection film (SiN/SiO$_2$, 0.1 μm/0.3 μm in thickness) 33 was applied. Also, the protection film 33 coating the contact layer 48 and the peripheral surface (the exposed surface of the substrate 41) 55 of the mesa 53 was partially removed to form the electrodes (TiPtAu, 1.5 μm in thickness) 31 and 32, and the back surface of the substrate 41 (the side reverse to where the mesas 49 and 53 were formed) was coated with the anti-reflection film (SiN, 0.12 μm in thickness) 34 to form a chip.

When a reverse bias was applied to the fabricated chip, the breakdown voltage (Vb) was 30 V and the dark current at 0.9 Vb was 100 nA, both sufficiently low. In a high temperature reverse-biased test to predict reliability, it was found that a high level of reliability corresponding to 100,000 hours at 85° C. was achieved.

Embodiment 4

Figure 14:
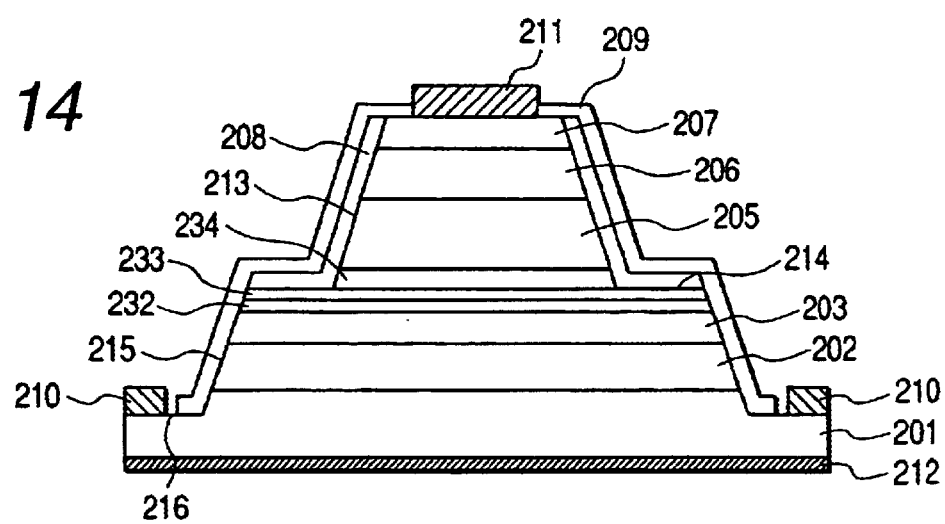
FIG. 14 is a sectional view for describing another avalanche photo-diode, which is a fourth preferred embodiment of the invention.

FIG. 14 is a sectional view for describing a back-illuminated type avalanche photo-diode, which is fabricated according to the present invention. A method for its fabrication will be described with reference to FIGS. 15a, 15b, 15c, 15d and 15e.

Figure 15A:
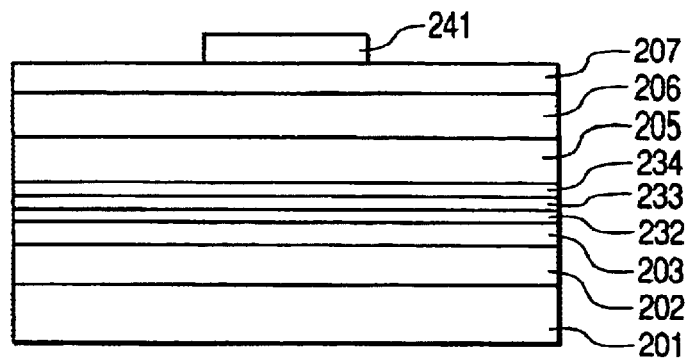
FIGS. 15a, 15b, 15c, 15d and 15e are a process flow diagram for describing a fabrication method for the fourth embodiment.
Figure 15B:
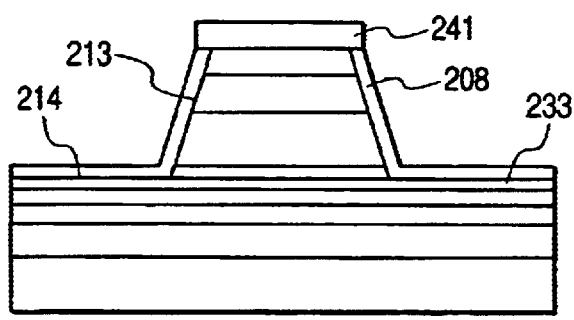

FIG. 15a is a sectional view of a semiconductor layer that was used, wherein reference numeral 201 denotes an InP substrate (n-type, 2×10$^{18}$ cm$^{-3}$); 202, an InAlAs buffer layer (n-type, 2×10$^{18}$ cm$^{-3}$, 0.7 μm); 203, an InAlAs multiplication layer (n-type, 5×10$^{14}$ cm$^{-3}$, 0.2 μm); 232, an InAlAs field control layer (p-type, 7×10$^{17}$ cm$^{-3}$, 0.02 μm); 233, an InGaAs field control layer (p-type, 7×10$^{17}$ cm$^{-3}$, 0.01 μm); 234, an InAlAs field control layer (p-type, 7×10$^{17}$ cm$^{-3}$, 0.02 μm); 205, an InGaAs absorption layer (p-type, 2×10$^{15}$ cm$^{-3}$, 1.2 μm); 206, an InGaAs cap layer (p-type, 2×10$^{18}$ cm$^{-3}$ μm); and 207, an InGaAs contact layer (p-type, 5×10$^{19}$ cm$^3$, 0.1 μm). An SiO$_2$ mask 241 having a diameter of 35 μm was formed over the surface of the layer 207.

Removal by etching was carried out to the InAlAs field control layer 234 by alternately applying etching solutions selectively working on InAlAs and the InGaAs to the above-described composition. Hereupon, in order to protect the side surface 213 and the peripheral surface 214 of the second mesa 49 which have been exposed, an InP semiconductor protection film 208 (undoped, 0.1 μm) was provided by MOVPE to achieve the state shown in FIG. 15b. The process so far described reduced the thickness of the field control layer on the mesa periphery to less than that of the field control layer of the mesa center.

Figure 15C:
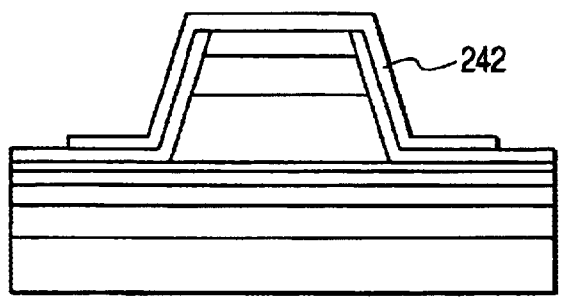

Next, the SiO$_2$ mask 241 was removed, and a photo-resist mask 242 was newly formed into the state shown in FIG. 15c. The photo-resist mask 242 measures 45 μm in diameter, and is positioned concentrically with the mask 241 of FIG. 15a.

Figure 15D:
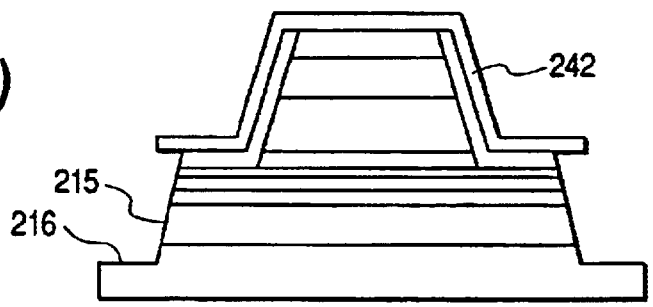
Figure 15E:
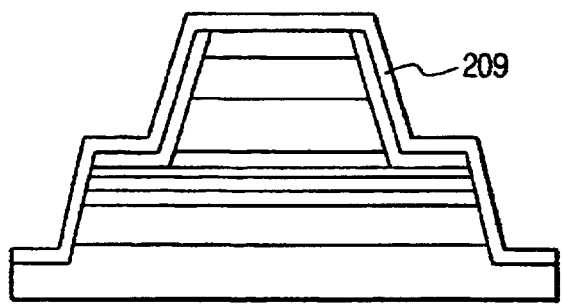

Wet etching was carried out down to the substrate 1 into the state shown in FIG. 15d, wherein reference numeral 215 denotes a side surface of the first mesa formed, 216 denotes a peripheral surface of the first mesa.

Next, the photo-resist mask 242 was removed, and coating with a protection film (SiN/SiO$_2$, 0.1 μm/0.3 μm in thickness) 209 was applied from the contact layer 207 to the peripheral surface 216 of the first mesa.

Finally, the protection film 209 coating the contact layer 207 and the peripheral surface (the exposed surface of the substrate) 216 of the first mesa was partially removed to form the electrodes (TiPtAu, 1.5 μm in thickness) 210 and 211, and the back surface of the substrate was coated with the anti-reflection film (SiN, 0.12 μm in thickness) 212 to form a chip.

When a reverse bias was applied to the fabricated chip, the breakdown voltage (Vb) was 24 V and the dark current at 0.9 Vb was 50 nA. In a high temperature reverse-biased load test (constant at 200° C., 100 μA), the voltage variation 1000 hours later was no more than 1 V, and neither the breakdown voltage nor the dark current at room temperature manifested any change from their respective pre-test levels, revealing generally satisfactory performance. The multiplication rate of optical signals was 50 at the maximum, proving uniform at the mesa center.

Embodiment 5

Figure 16:
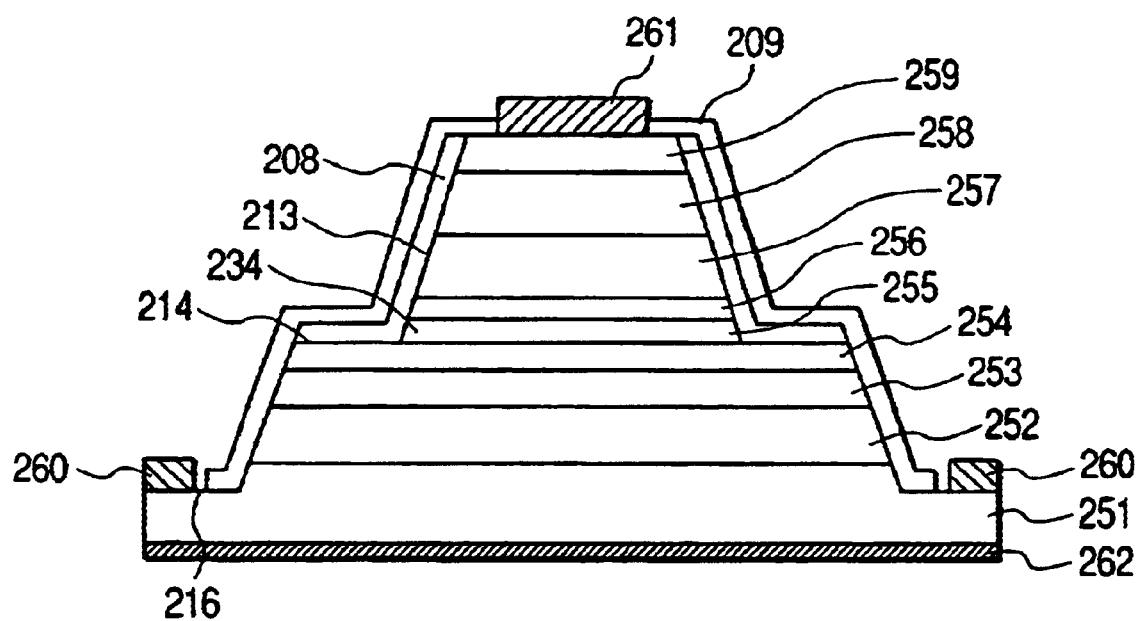
FIG. 16 is a sectional view for describing still another avalanche photo-diode, which is a fifth preferred embodiment of the invention.

FIG. 16 is a sectional view of a back-illuminated type avalanche photo-diode, which is fabricated according to the present invention.

Reference numeral 251 denotes an InP substrate (conductivity type: p; carrier concentration: 1×10$^{19}$ cm$^{-3}$); 252, an InP buffer layer (p-type, 2×10$^{18}$ cm$^{-3}$, 0.7 μm); 253, an InP multiplication layer (p-type, 5×10$^{14}$ cm$^{-3}$, 0.2 μm); 254, an InP field control layer (n-type, 7×10$^{17}$ cm$^{-3}$, 0.03 μm); 255, an InGaAs field control layer (n-type, 7×10$^{17}$ cm$^{-3}$, 0.01 μm); 256, an InP field control layer (n-type, 7×10$^{17}$ cm$^{-3}$, 0.01 μm); 257, an InGaAs absorption layer (n-type, 2×10$^{15}$ cm$^{-3}$, 1.2 μm); 258, an InP cap layer (n-type, 2×10$^{18}$ cm$^{-3}$, 1 μm); and 259, an InGaAs contact layer (n-type, 2×10$^{18}$ cm$^{-3}$, 0.1 μm). These multi-layered films were grown by MOVPE. The fabrication process was similar to that illustrated in FIG. 15, except that an InP (undoped, 0.1 μm) was added only over the side surface 213 and the peripheral surface 214 of the second mesa, and coating with an insulating film 209 (SiN/SiO$_2$, 0.1 μm/0.3 μm in thickness) was applied from the contact layer 259 to the peripheral 216 of the first mesa as shown in FIG. 16.

Finally, as shown in FIG. 16, the protection film 209 coating the contact layer 259 and the peripheral surface (the exposed surface of the substrate) 216 of the first mesa was partially removed to form the electrodes (TiPtAu, 1.5 μm in thickness) 260 and 261, and the back surface of the substrate reverse to where the mesas were formed) was coated with the anti-reflection film (SiN, 0.12 μm in thickness) 262 to form a chip.

When a reverse bias was applied to the fabricated chip, the breakdown voltage (Vb) was 24 V and the dark current at 0.9 Vb was 50 nA. In a high temperature reverse-biased load test (constant at 200° C., 100 μA), the voltage variation 1000 hours later was no more than 1 V, and neither the breakdown voltage nor the dark current at room temperature manifested any change from their respective pre-test levels, revealing generally satisfactory performance. The multiplication rate of optical signals was 50 at the maximum, proving uniform at the mesa center.

Figure 17:
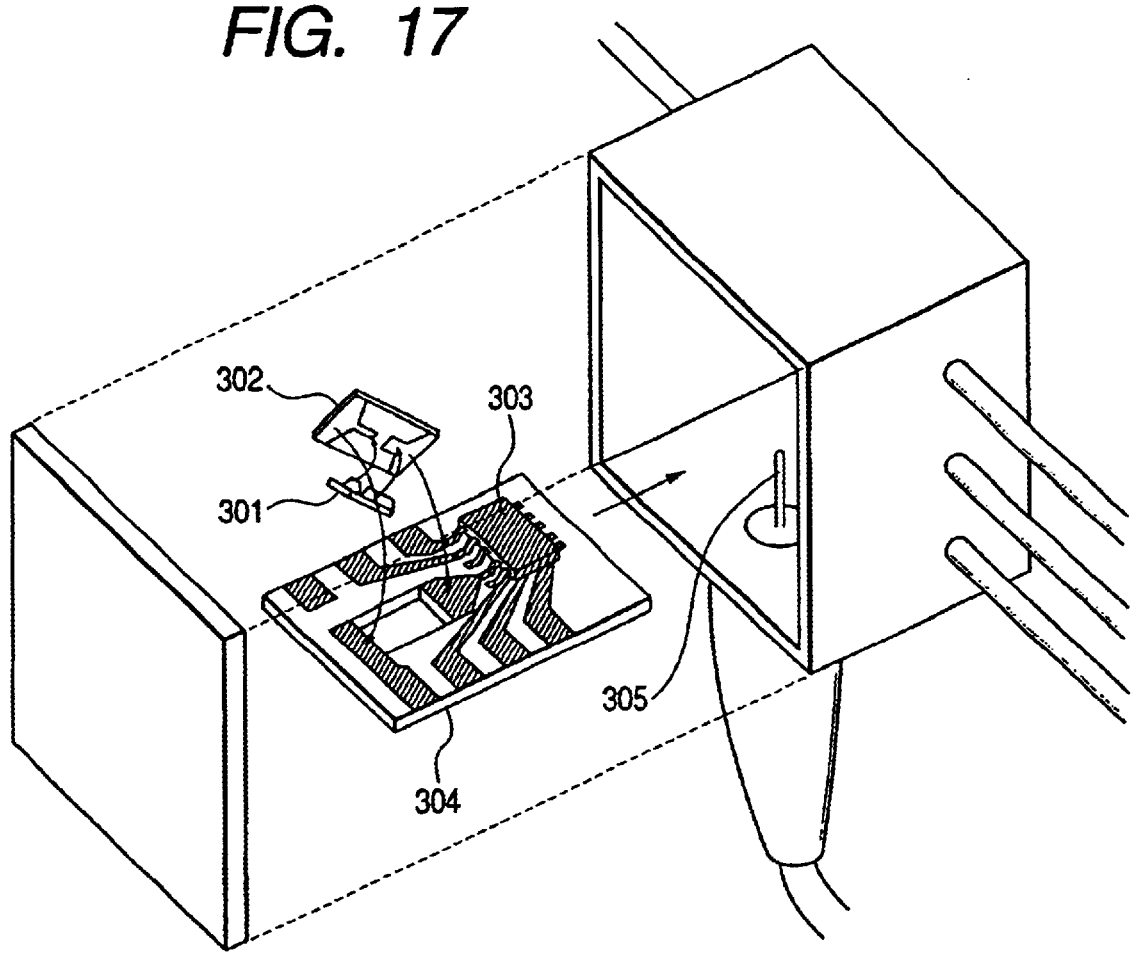
FIG. 17 illustrates how an optical module according to the invention is packaged.

Embodiments 1 through 5 are surface-illuminated type photo-diodes, and how one of these elements is packaged into an optical module is illustrated in FIG. 17. The upper surface side of a chip 301 is bonded onto a submount 302. Reference numeral 303 denotes a preamplifier; 304, an optical module substrate; and 305, an optical fiber.

Figure 18:
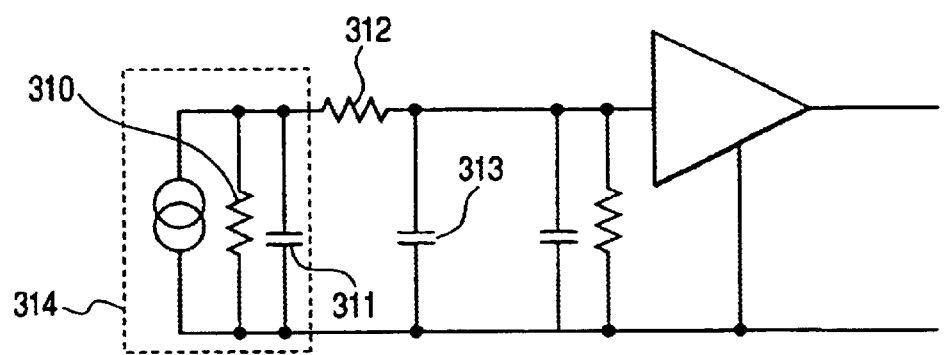
FIG. 18 is a schematic diagram of an equivalent circuit of the optical module according to the invention.

FIG. 18 is a schematic diagram of an equivalent circuit of the optical module. A broken line-marked part 314 including an element resistor 310 and an element capacitor 311 is the equivalent circuit of the element, 312 denoting a contact resistor and 313, a parasitic capacitor.

Embodiment 6

Figure 19A:
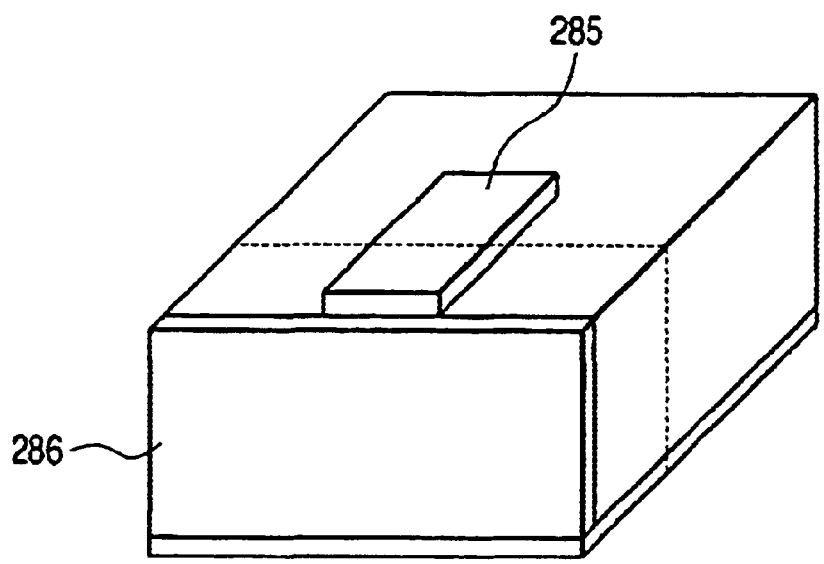
FIG. 19a is a bird's eye view for describing still another avalanche photo-diode, which is a sixth preferred embodiment of the invention.
Figure 19B:
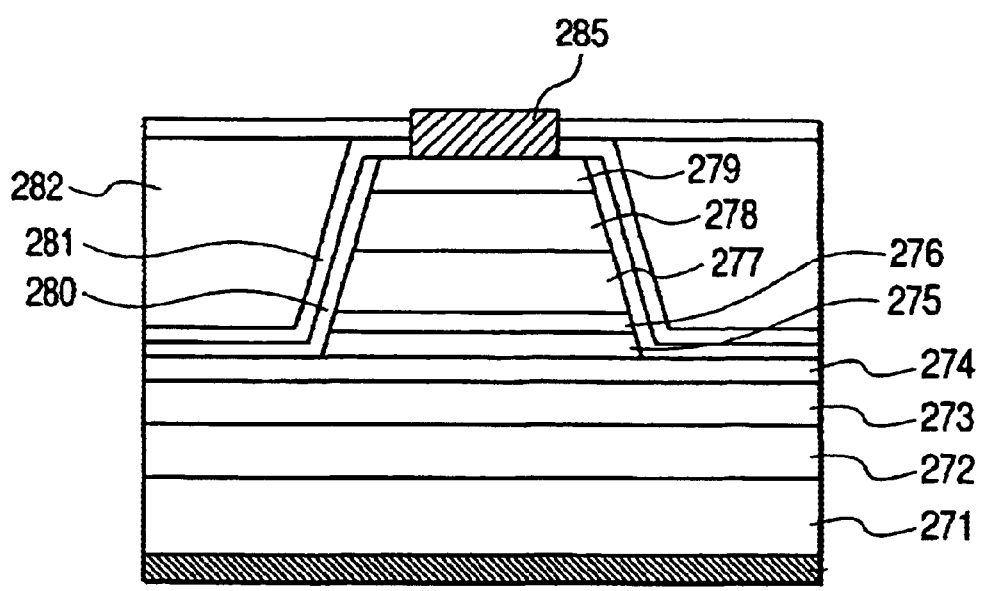

FIG. 19a shows a bird's eye view of a waveguide type avalanche photo-diode fabricated according to the invention, and FIG. 19b, a sectional structure of the broken line-marked part of FIG. 19a.

Reference numeral 271 denotes an InP substrate (n-type, 2×10$^{18}$ cm$^{-3}$); 272, an InAlAs buffer layer (n-type, 2×10$^{18}$ cm$^{-3}$, 0.7 μm); 273, an InAlAs multiplication layer (n-type, 5×10$^{14}$ cm$^{-3}$, 0.2 μm); 274, an InP field control layer (p-type, 7×10$^{17}$ cm$^3$, 0.03 μm); 275, an InGaAs field control layer (p-type, 7×10$^{17}$ cm$^{-3}$, 0.01 μm); 276, an InP field control layer (p-type, 7×10$^{17}$ cm$^{-3}$, 0.01 μm); 277, an InGaAs absorption layer (p-type, 2×10$^{15}$ cm$^{-3}$, 1.2 μm); 278, an InP cap layer (p-type, 2×10$^{18}$ cm$^{-3}$, 1 μm); and 279, an InGaAs contact layer (p-type, 5×10$^{19}$ cm$^{-3}$, 0.1 μm). These multi-layered films were grown by MOVPE. After mesas were formed, coating with an InP (undoped, 0.1 μm) semiconductor protection film 280 and an insulating film 281 (SiN/SiO$_2$, 0.1 μm/0.3 μm in thickness) was applied, and a polyimide layer 282 was formed over the protection film to flatten the upper surface of the element. The mesa width at the lower end of the absorption layer 277 was set to be 40 μm and the length of the p-electrode 285, 100 μm, and the end face on the illuminated side was coated with an anti-reflection film (SiN, 0.12 μm in thickness) 286 as shown in FIG. 19a.

When a reverse bias was applied to the chip, the breakdown voltage (Vb) was 24 V and the dark current at 0.9 Vb was 50 nA. In a high temperature reverse-biased load test (constant at 200° C., 100 μA), the voltage variation 1000 hours later was no more than 1 V, and neither the breakdown voltage nor the dark current at room temperature manifested any change from their respective pre-test levels, revealing generally satisfactory performance. The multiplication rate of optical signals was 50 at the maximum, proving uniform at the mesa center.

Since embodiments of the present invention make it possible to suppress the electric field intensity of the pn junction positioned on the side surface of the mesa, reliable avalanche photo-diodes with low dark currents can be fabricated, which is impossible with conventional mesa-structured semiconductor apparatuses. Mesa-structured semiconductor apparatuses are simple in fabrication process and, moreover, elements embodying the invention do not use impurity dispersion, a usual practice for conventional planar structure elements, but permits electric field control by epitaxial growth and etching. Accordingly, they are highly controllable and offer a high yield. Therefore, embodiments of the invention provide the possibility of low-cost production of high performance gigabit-class high speed elements, which is an industrially significant advantage.

Moreover, elements embodying the invention have a carrier multiplying, i.e. current amplifying, function, which can be utilized to simplify the amplifier circuit, which had to be separate units for conventional optical receivers. Therefore, not only are the elements made less expensive, but also are optical receivers using such elements and optical modules mounted with such optical receivers reduced in cost.

Furthermore, since elements embodying the invention are significantly reduced in surface electric field compared with such elements according to the prior art, surface leak currents, i.e. dark currents, are reduced. This means enhanced sensitivity and improved performance for receivers themselves.

Thus, the invention enables such elements to be improved in performance compared with conventional such products.

What is claimed is:

1. An avalanche photo-diode comprising:
   an absorption layer for absorbing light to generate a carrier,
   a multiplication layer for multiplying the generated carrier,
   a field control layer inserted between said absorption layer and said multiplication layer, and
   a substrate over which these layers are provided,
   wherein a carrier concentration or a film thickness of said field control layer is relatively less in a peripheral part of the field control layer than a corresponding carrier concentration or a corresponding film thickness in an inner part or in a central part of the field control layer.

2. The avalanche photo-diode, according to claim 1, wherein:
   said field control layer has first and second field control layers,
   the avalanche photo-diode further comprises, at one section of the device, a first mesa-shaped part having said multiplication layer and said first field control layer, and a second mesa-shaped part having said second field control layer and said absorption layer, and
   an area of a top portion facing a bottom portion of said first mesa-shaped part is greater than an area of a bottom portion facing a top portion of said second mesa-shaped part.

3. The avalanche photo-diode, according to claim 2, wherein a protection film, a semiconductor film or an insulator is provided over at least part of a side surface of each of said first mesa-shaped part and said second mesa-shaped part.

4. The avalanche photo-diode, according to claim 2, wherein a burying-layer is provided on the side surface of said second mesa-shaped part.

5. The avalanche photo-diode, according to claim 4, wherein a carrier concentration in said burying-layer is less than a carrier concentration in said absorption layer.

6. The avalanche photo-diode, according to claim 4, wherein a protection film, a semiconductor film or an insulator is provided over at least part of a side surface of each of said first mesa-shaped part and said burying-layer.

7. The avalanche photo-diode, according to claim 6, wherein a carrier concentration in said burying-layer is less than a carrier concentration in said absorption layer.

8. The avalanche photo-diode, according to claim 1, further comprising:
   a buffer layer provided between said substrate and said multiplication layer,
   a cap layer, a contact layer and an electrode, these being provided at a side of said absorption layer opposite to said field control layer, and
   an electrode provided on said substrate,
   wherein element operation is actuated by the application of a voltage between the both electrodes.

9. An avalanche photo-diode comprising:
   an absorption layer for absorbing light to generate a carrier,
   a multiplication layer for multiplying the generated carrier,
   a field control layer inserted between said absorption layer and said multiplication layer,
   a substrate over which these layers are provided, wherein:
   said field control layer has first and second field control layers,
   the avalanche photo-diode further comprises, at one section of the device, a first mesa-shaped part having said multiplication layer and said first field control layer, and a second mesa-shaped part having said second field control layer and said absorption layer; and
   an area of a top portion facing a bottom portion of said first mesa-shaped part is greater than an area of a bottom portion facing a top portion of said second mesa-shaped part.

10. The avalanche photo-diode, according to claim 9, wherein a carrier concentration or a film thickness of said field control layer is relatively less in a peripheral part of the field control layer than a corresponding carrier concentration or a corresponding film thickness in an inner part or in a central part of the field control layer.

11. The avalanche photo-diode, according to claim 9, wherein a protection film, a semiconductor film or an insulator is provided over at least part of a side surface of each of said first mesa-shaped part and said second mesa-shaped part.

12. The avalanche photo-diode, according to claim 9, wherein a burying-layer is provided on the side surface of said second mesa-shaped part.

13. The avalanche photo-diode, according to claim 12, wherein a carrier concentration in said burying-layer is less than a carrier concentration in said absorption layer.

14. The avalanche photo-diode, according to claim 11, wherein a protection film, a semiconductor film or an insulator is provided over at least part of a side surface of each of said first mesa-shaped part and said burying-layer.

15. The avalanche photo-diode, according to claim 14, wherein a carrier concentration in said burying-layer is less than a carrier concentration in said absorption layer.

16. The avalanche photo-diode, according to claim 9, further comprising:
   a buffer layer provided between said substrate and said multiplication layer,
   a cap layer, a contact layer and an electrode, these being provided at a side of said absorption layer opposite to said field control layer, and
   an electrode provided on said substrate,
   wherein element operation is actuated by the application of a voltage between the both electrodes.

* * * * *